United States Patent [19]

Inami et al.

[11] Patent Number: 4,577,188

[45] Date of Patent: Mar. 18, 1986

[54] LEVEL DISPLAY DEVICE FOR AUDIO SIGNAL

[75] Inventors: Mamoru Inami, Yokohama; Yoshiaki Tanaka, Fujisawa; Zenju Ohtsuki, Tokyo, all of Japan

[73] Assignee: Victor Company of Japan, Ltd., Yokohama, Japan

[21] Appl. No.: 412,968

[22] Filed: Aug. 30, 1982

[30] Foreign Application Priority Data

Sep. 3, 1981 [JP] Japan .............................. 56-138861
Sep. 3, 1981 [JP] Japan .............................. 56-138862
Sep. 3, 1981 [JP] Japan .............................. 56-138863
Sep. 3, 1981 [JP] Japan .............................. 56-138864

[51] Int. Cl.$^4$ .......................................... G09G 1/00
[52] U.S. Cl. .................................. 340/721; 340/722
[58] Field of Search ..................... 340/722, 734, 721

[56] References Cited

U.S. PATENT DOCUMENTS

| 2,465,355 | 3/1949 | Cook .................................. 340/722 |
| 2,957,104 | 10/1960 | Roppel .............................. 340/722 |
| 3,474,438 | 10/1969 | Lauher .............................. 340/722 |
| 3,648,270 | 3/1972 | Metz et al. ........................ 340/722 |
| 3,778,811 | 12/1973 | Gicca et al. ...................... 340/722 |

Primary Examiner—Marshall M. Curtis
Attorney, Agent, or Firm—Roberts, Spiecens, and Cohen

[57] ABSTRACT

A level display device for audio signal comprises a plurality of bandpass filters having filtering bands of respectively different center frequencies, for band-dividing and filtering an input signal supplied thereto through an input terminal, a pulse width converter provided in correspondence with respective bandpass filters, for converting the input signal into a signal in synchronism with a vertical synchronizing signal of a video signal and having a pulse width in accordance with the level of the vertical synchronizing signal, a level indication signal producing circuit connected with outputs of the pulse width converter in parallel, for serially producing the converted pulse signal in synchronism with a horizontal synchronizing signal by successively time-dividing the converted pulse signal during a horizontal scanning period, a character indication signal producing circuit stored with information signals for displaying characters and the like, for serially obtaining a character indication signal in synchronism with a synchronizing signal of the video signal, and a video signal composing circuit driven by the video signal, for obtaining a video signal by composing an output of the level indication signal producing circuit and an output of the character indication signal producing circuit. Bars corresponding to the audio signal level in a vertical direction, characters, and the like, are composed and displayed on a screen of a picture tube, by the outputs of the level indication signal producing circuit and the character indication signal producing circuit.

10 Claims, 27 Drawing Figures

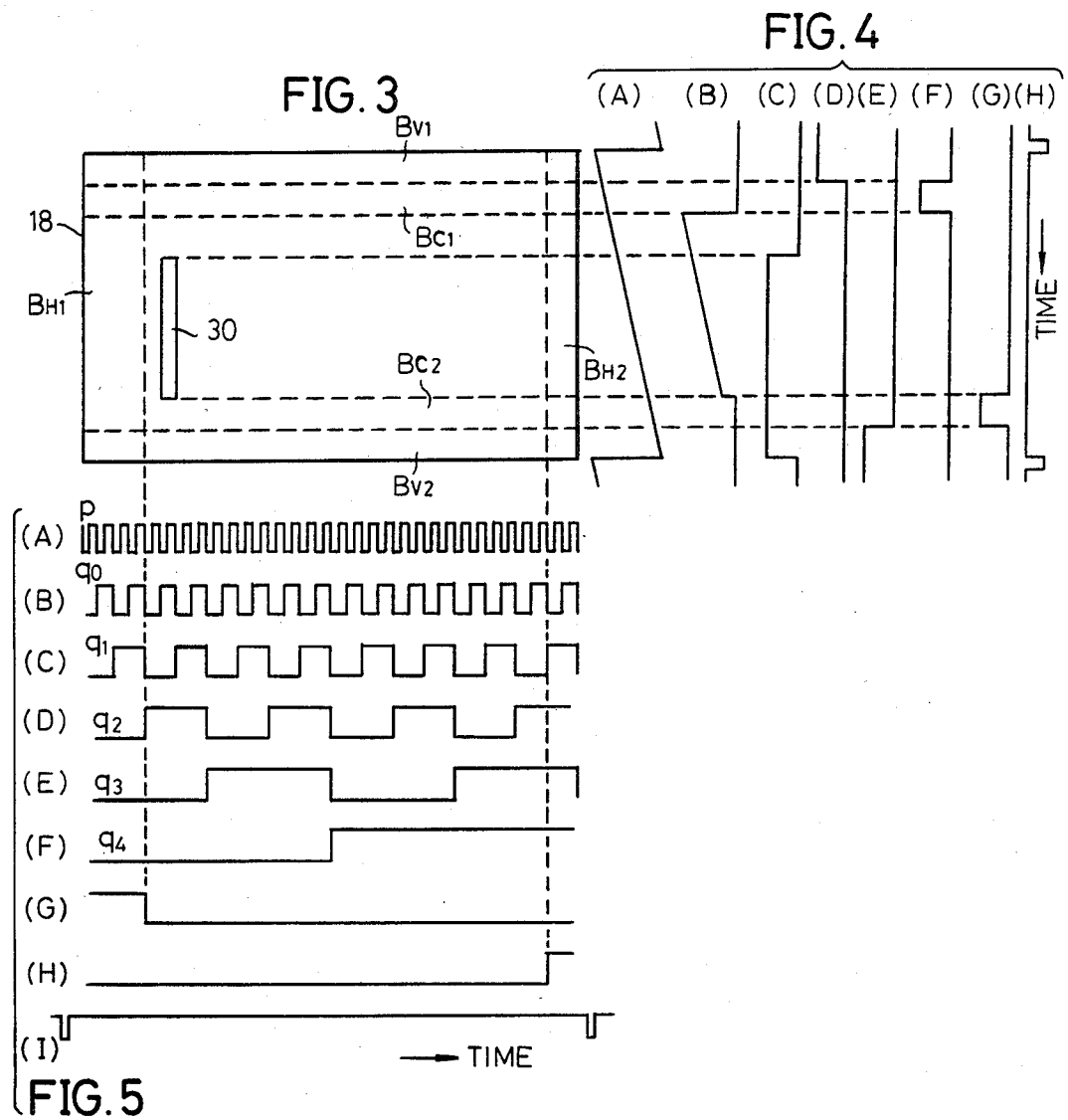

LEVEL DISPLAY DEVICE FOR AUDIO SIGNAL

BACKGROUND OF THE INVENTION

The present invention generally relates to level display devices for audio signals, and more particularly to a level display device for audio signal constructed to display bars having lengths corresponding to the input signal levels on a picture tube.

Generally, when recording an audio signal, there are cases where it is desirable to carry out recording by increasing or decreasing levels in a predetermined frequency band. In addition, when degradation is introduced in the fidelity of a reproduced audio signal in a reproducing apparatus due to effects caused by the frequency characteristics of audio equipment themselves such as speakers and pickup cartridges, the transmission characteristic of a listening room, and the like, there are cases where it is desirable to correct the levels in a predetermined frequency band. Further, there are cases where the frequency characteristic is not made flat during the recording and reproduction, and the frequency characteristic is set to a predetermined characteristic according to the needs. In the above described cases, graphic equalizers capable of variably adjusting the signal level in each of the divided frequency bands are used. When adjusting the level by the graphic equalizer, a level display device is used for displaying the levels throughout the entire band of the input signal and the signal levels in each of the frequency bands.

A conventional level display device was constructed to illuminate a number of light emitting diodes corresponding to the number of input signal levels. Moreover, another conventional level display device was constructed to display bars having lengths corresponding to the input signal levels on a screen of a picture tube.

However, in the above conventional level display devices, numerals for indicating each of the frequency bands, and numerals or scales indicating the level of the signal, are marked on a manipulation panel and the like. Accordingly, there was difference in brightness between the above numerals or scale and the level indication part such as bars displayed on the screen of the picture tube, and there was a disadvantage in that it was difficult to accurately read out the indication visually.

On the other hand, another conventional level display device was constructed to display with no difference in brightness between channels, when displaying the bars of right and left channels side by side, for example. Thus, in this conventional device, it was difficult to discriminate the channels, and there was a disadvantage in that the read out may be erroneously performed.

Further, another conventional level display device was provided with a logarithmic amplifier for each of the frequency bands, for logarithmicly converting the level of the input signal. Hence, this conventional device was easily affected by the ambient temperature, and for this reason was unable to display the correct levels. In addition, there was a disadvantage in that the circuit was complex.

In another conventional level display device, the bars were not displayed while the input signal is not supplied thereto. Accordingly, in this conventional device, the starting positions of the bars were unclear when there is no input signal. Therefore, there was a disadvantage in that it was difficult to visually read out the character display of the frequencies in correspondence with the bars.

Furthermore, in another conventional level display device, scale lines were not displayed on the screen. Accordingly, in this conventional device, there was a disadvantage in that it was difficult to read out the levels of the bars.

SUMMARY OF THE INVENTION

Accordingly, it is a general object of the present invention to provide a novel and useful level display device for audio signal, in which the above described disadvantages have been overcome.

Another and more specific object of the present invention is to provide a level display device provided with blanking means for not obtaining a signal from level indication signal producing means during a predetermined interval. In the device according to the present invention, if there is an incoming input signal having a level exceeding the level which can be displayed, a crosstalk signal introduced due to the shifted timing of a decoded signal in a multiplexer is blanked, so that the crosstalk signal is not displayed. According to the device of the present invention, bars and characters do not overlap, and the bars and the characters can be clearly displayed.

Still another object of the present invention is to provide a level display device for displaying the stereo signal level in right and left channels side by side, for each of the frequency bands.

Another object of the present invention is to provide a level display device for displaying the stereo signal level in the right and left channels side by side, for each of the frequency bands, and also displaying the signal level within the entire frequency band including each of the above frequency bands in the right and left channels side by side.

A further object of the present invention is to provide a level display device provided with converting means for obtaining the signal from the level indication signal producing means, by separately converting the signal into different voltages for each of the channels. According to the device of the present invention, it is possible to display bars with difference in brightness for the different channels, to facilitate the visual read out of the bars.

Still another object of the present invention is to provide a level display device provided with means for comparing a rectified audio signal with a comparison voltage which varies exponentially with respect to time. According to the device of the present invention, it is unnecessary to provide a logarithmic amplifier for each of the frequency bands, and the device can operate stably without being affected by ambient temperature.

Another object of the present invention is to provide a level display device provided with means for displaying start positions of bars even if the audio signal is not obtained. According to the device of the present invention, because the starting positions of the bars are always displayed, it is easy to visually read out the bars in correspondence with the character display of the frequencies.

A further object of the present invention is to provide a level display device in which scale lines are always displayed on the screen for displaying the bars, so as to facilitate the visual read out of the levels of the bars.

Other objects and further features of the present invention will be apparent from the following detailed

BRIEF DESCRIPTION OF THE DRAWINGS

FIG. 3 is a diagram for explaining a display pattern on the screen of the picture tube obtained by the circuit shown in FIG. 2;

FIGS. 4(A) through 4(H) and FIGS. 5(A) through 5(I) are graphs respectively showing signal waveforms for obtaining the display pattern shown in FIG. 3;

DETAILED DESCRIPTION

Figure 1:
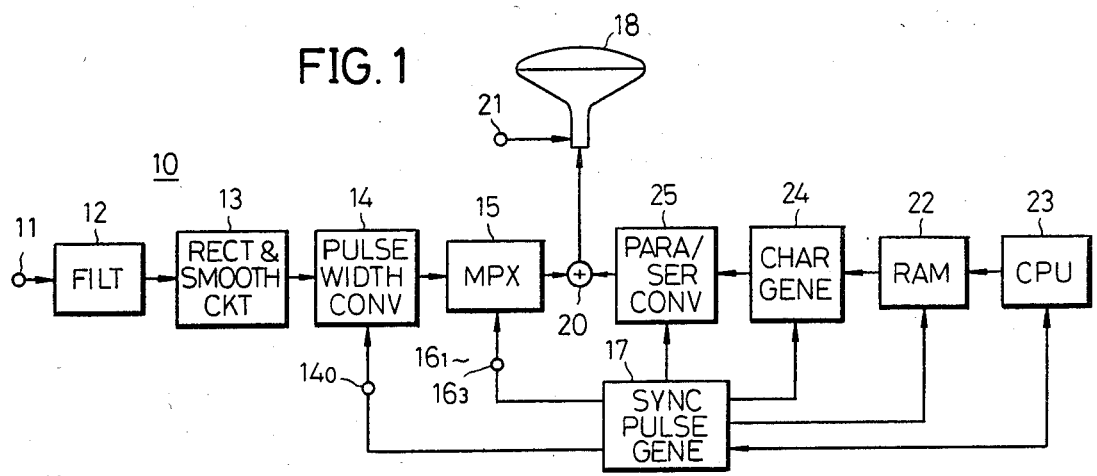
FIG. 1 is a general systematic block diagram showing a first embodiment of a level display device for audio signal according to the present invention.

First, description will be given with respect to a first embodiment of a level display device for audio signal according to the present invention. In FIG. 1, an audio signal applied to an input terminal 11 is divided into a plurality of frequency bands at a filter 12, and then formed into a DC signal by being supplied to a rectifying and smoothing circuit 13. An output signal of the circuit 13 is supplied to a pulse width converter 14 wherein the signal is converted into a signal in synchronism with a vertical synchronizing signal and has a pulse width in accordance with the input signal level. The converted signal is then supplied to a multiplexer 15, and is serially obtained in successive time division during a horizontal scanning period. The signal thus obtained from the multiplexer 15 is supplied to an adding gate 20 as a level indication signal. The pulse width converter 14 and the multiplexer 15 operate when supplied with a synchronizing signal from a synchronizing pulse generator 17.

On the other hand, a random access memory (RAM) 22 is operated by a control signal from a central processing unit (CPU) 23. In formation containing characters and the like which are to be displayed on a screen of a picture tube 18 is read out from the RAM 22, and supplied to a character generator 24. Binary codes corresponding to predetermined characters are obtained from the character generator 24 in parallel, and supplied to the adding gate 20 as a character indication signal after being converted into a series signal at a parallel-to-serial converter (parallel/serial converter) 25. The above CPU 23, RAM 22, character generator 24, and the parallel/serial converter 25 respectively operate when supplied with the synchronizing signal from the synchronizing pulse generator 17.

The level indication signal from the multiplexer 15 and the character indication signal from the parallel/serial converter 25 are added at the adding gate 20, and supplied to the picture tube 18. An output of the adding gate 20 is added with the synchronizing signal at the picture tube 18 and formed into a composite video signal. Accordingly, characters and levels are composed and displayed on the picture tube 18.

A left-channel (an L-channel) input audio signal, for example, is applied to the input terminal 11 (11a) of a level display device 10. The input audio signal is then supplied to a narrow-bandpass filter 12a comprising narrow-bandpass filters 12a1 through 12an, and a full-bandpass filter 12am (filter 12). The narrow-bandpass filters 12a1 through 12an respectively have narrow-bandpass filter characteristics for filtering narrow bands comprising center frequencies at 40 Hz, 150 Hz, 400 Hz, 1 kHz, 2.4 kHz, 6 kHz, 10 kHz, and 15 kHz, for example. On the other hand, the full-bandpass filter 12am has a full-bandpass filter characteristic including all the frequency bands of the narrow-passband filter 12a.

Signals filtered and band-divided at the filters 12a1 through 12an, and an output full-band signal of the filter 12am, are respectively supplied to rectifying and smoothing circuits 13a1 through 13an and 13am wherein the signals are rectified and smoothened. Outputs of the circuits 13a1 through 13an and 13am are then supplied to one input terminal of respective comparators 14a1 through 14an and 14am (pulse width converter 14). A comparison voltage shown in FIG. 4(A) is supplied to the other input terminals 14o of the above comparators 14a1 through 14an and 14am. The comparison voltage is in synchronism with the vertical synchronizing signal of a composite video signal shown in FIG. 4(H) which is obtained from the synchronizing signal generator 17, and the voltage level decreases (or increases) with time.

Level comparison is performed between the output signals of the circuits 13a1 through 13an and 13am and the comparison voltage, at the comparators 14a1 through 14an and 14am. Hence, the output signals of the circuits 13a1 through 13an and 13am are respectively converted into pulse signals having pulse widths corresponding to the levels of the above output signals. The zero level is adjusted at a level converter comprising diodes Do1 through Don and Dom and resistors Ro1 through Ron and Rom, and the outputs of the level converter are supplied to multiplexers $15_1$ and $15_2$ (15). The above level converter converts the outputs of the pulse width converter 14 which varies between the power sources voltages (+Vc and −Vc), into logic levels required at the multiplexer 15 constructed from TTL.

The above described signal processing is similarly performed with respect to a right channel (an R-channel) signal applied to an input terminal 11b. That is, signals obtained from narrow-bandpass filters 12b1 through 12bn and a full-bandpass filter 12bm are respectively rectified and smoothened at rectifying and smoothing circuits 13b1 through 13bn and 13bm, and supplied to the multiplexers $15_1$ and $15_2$ after being subjected to pulse width conversion at comparators 14b1 through 14bn and 14bm. The multiplexers $15_1$ and $15_2$ are constructed so that the L-channel and R-channel signals are alternately supplied to input terminals arranged in parallel.

The multiplexers $15_1$ and $15_2$ are simultaneously supplied with a signal p shown in FIG. 5(A) in synchronism with a horizontal synchronizing signal within the composite video signal shown in FIG. 5(I) and signal q0 through q3 shown in FIGS. 5(B) through 5(E), to a decoding signal input terminal $16_1$ in parallel. The signals q0 through q3 are obtained by successively frequency-dividing the signal p. By the 5-bit combination of the above signals p and q0 through q3, a horizontal scanning direction switching signal is obtained with a predetermined interval. The signals supplied to the input terminals of the multiplexers $15_1$ and $15_2$ are successively subjected to time division during the horizontal scanning period by the above switching signal, and accordingly obtained serially. That is, during one horizontal scanning period of the video signal, a full-band signal and each of the narrow-band spectral signals are successively obtained serially with a predetermined interval, and with a timing corresponding to each of the horizontal direction display positions on the screen of a picture tube 18 (for example, the display interval in the horizontal direction has the pulse width of the pulse q0).

In this case, a strobe signal q4 shown in FIG. 5(F) is supplied to an input terminal $19_7$ of a blanking signal and strobe signal generator 19, and the same strobe signal is produced from the signal generator 19. The strobe signal q4 is supplied to the multiplexers $15_1$ and $15_2$ through terminals $16_2$ and $16_3$. Accordingly, the multiplexers $15_1$ and $15_2$ becomes synchronized with the strobe signal q4, and alternately produces a signal serially with one-half the period of one horizontal scanning period.

For example, observation will first be made with respect to the full-band signal of the L-channel displayed at the upper left hand side of the screen of the picture tube 18. When a pulse signal shown in FIG. 4(C) is obtained from the comparator 14am, a high-level signal from the comparator 14am is gated by the horizontal scanning direction switching signal and obtained, at a predetermined time within one horizontal scanning period in a part corresponding to a rising point of the above pulse signal. At a predetermined time within a succeeding horizontal scanning period, a high-level signal is similarly gated and obtained from the comparator 14am. During the high-level period of the pulse signal shown in FIG. 4(C), signals are repeatedly and serially obtained from the multiplexers $15_1$ and $15_2$ with predetermined intervals, for every one horizontal scanning period. The signals thus repeatedly obtained, are supplied to the picture tube 18 through the adding gate 20 comprising OR-circuits. The vertical synchronizing signal and the horizontal synchronizing signal are supplied to an input terminal 21 of the picture tube 18. The signal in accordance with the level of the audio signal obtained from the adding gate 20, the vertical synchronizing signal, and the horizontal synchronizing signal are mixed at the picture tube 18, and formed into the composite video signals.

During an interval corresponding to the level of the audio signal shown in FIG. 4(C), the signals are gated at the multiplexers $15_1$ and $15_2$. Hence, the level of the audio signal is displayed on the screen of the picture tube 18 as a bar 30. Here, the timing with which the switching signal corresponding to the full-band of the L-channel is generated, does not correspond to a horizontal synchronizing part corresponding to other spectral signals. Thus, none of the other spectral signals are displayed by the above switching signal.

Figure 6A:
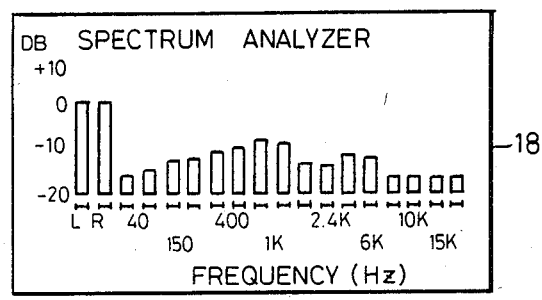
FIGS. 6A, 6B, and 6C are diagrams respectively showing display patterns obtained by the circuit shown in FIG. 2.
Figure 6B:
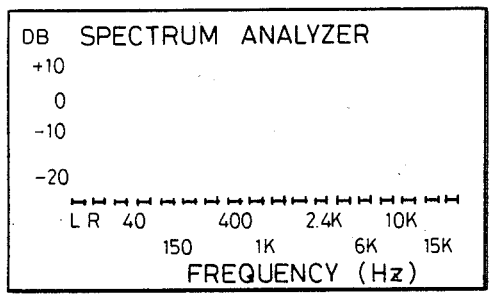
Figure 6C:
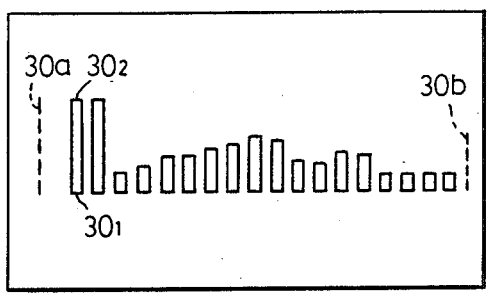

Signals in other frequency bands are similarly displayed as bars. The signals in the other frequency bands are converted into pulse signals having pulse widths respectively corresponding to the signal levels, by comparators respectively provided in correspondence with each of the frequency bands. Thus, the full-band signal and each of the frequency band signals of the audio signal are displayed on the screen of the picture tube 18 as shown in FIG. 6(C), for example. In the screen of the picture tube 18, the signals in each of the frequency bands are displayed with the R-channel and the L-channel in side by side arrangement.

The above multiplexers are constructed from TTL. Accordingly, series conversion can be performed with a high speed. For example, compared to a case where a C-MOS multiplexer is used, high resolution can be obtained, and the bar display becomes clear and sharp. Therefore, it is sufficient to provide a memory of a small memory capacity in only a character display system which will be described hereinafter, and a memory is not required in a spectral display system.

Besides the above spectral display on the screen of the picture tube 18 by the above bars, character display is also made to indicate the frequencies, decibels, and the like as will be described hereinafter. Hence, in order to prevent the bars and the characters from overlapping, it becomes necessary to provide a part for the character display on the screen of the picture tube 18. Accordingly, signals shown in FIGS. 4(D) and 4(E) for blanking the bars in an upper part $B_{V1}$ and a lower part $B_{V2}$ including the vertical blanking part on the screen of the picture tube 18, a signal shown in FIG. 4(F) for blanking the bars in a first row part Bc1 for characters displayed on the screen of the picture tube 18, and a signal shown in FIG. 4(G) for blanking the bars in thirteenth through sixteenth row part Bc2 for characters displayed on the screen of the picture tube 18, are respectively supplied to terminals $19_1$ through $19_4$ of the blanking signal generator 19 from the synchronizing pulse generator 17. On the other hand, signals shown in FIGS. 5(G) and 5(H) for blanking the bars in a left part $B_{H1}$ and a right part $B_{H2}$ including the horizontal blanking part on the screen of the picture tube 18, are respectively supplied to terminals $19_5$ and $19_6$ of the blanking signal generator 19.

Accordingly, during the above interval in which the signals for blanking are respectively supplied to the terminals $19_1$ through $19_6$, the multiplexers $15_1$ and $15_2$ are strobed. For this reason, even if signals are obtained for displaying bars in the above described parts in the screen of the picture tube 18, the serial signals are not obtained from the multiplexers $15_1$ and $15_2$.

Therefore, bar display outside the display dynamic range (levels exceeding +10 dB and levels under −20 dB), display of a crosstalk signal introduced due to shifted timing of the decoding signals at the multiplexer $15_1$ and $15_2$ (bars $30a$ and $30b$ shown in FIG. 6C, for example), and the like are subjected to the blanking, and are not displayed on the screen of the picture tube 18.

On the other hand, the RAM 22 is operated by the control signal from the CPU 23, and produces a command signal indicating a predetermined character and its position. The RAM 22 stores thirty-two columns by sixteen rows of characters (alphabets, numerals, signs such as "+", "−", "()", and the like) on the screen of the picture tube 18, and positions of where the characters are to be displayed on the screen of the picture tube 18.

The character generator 24 comprises a memory corresponding to a dot matrix of the characters, numerals, and the like. Hence, binary codes corresponding to predetermined characters are produced in parallel from the memory of the character generator 24, according to the command signal supplied thereto from the RAM 22. The parallel signal in accordance with the command signal from the RAM 22 thus obtained from the character generator 24, is supplied to the parallel/serial converter 25. The above CPU 23, RAM22, character generator 24, and parallel/serial converter 25, are synchronously operated by an address signal from the synchronizing pulse generator 17.

The parallel signal from the character generator 24 is converted into a serial signal capable of scanning in the vertical and horizontal directions on the screen of the picture tube 18, by the address signal from the synchronizing pulse generator 17, at the parallel/serial converter 25. The character indication signal converted into a serial signal at the parallel/serial converter 25, is supplied to the picture tube 18 through the adding gate 20. The serial character indication signal is then added with the vertical synchronizing signal at the picture tube 18, and accordingly formed into the composite video signal. As a result, characters "FREQUENCY (Hz)", "SPECTRUM ANALYZER", and the like, and numerals "40", "150", "+10", and the like, are displayed on the screen of the picture tube 18 as shown in FIG. 6B. These characters and numerals are displayed on the screen of the picture tube 18 at the above bar blanking parts, that is, at the first row part Bc1, the thirteenth through sixteenth row parts Bc2, the left part $B_{H1}$, and the right part $B_{H2}$.

The spectral indication signal from the multiplexer 15 and the character indication signal from the parallel/serial converter 25 are added at the adding gate 20. Accordingly, the spectral display by bars and character display shown in FIG. 6A are simultaneously obtained on the screen of the picture tube 18. In this case, as shown in FIG. 6C, a starting point $30_1$ of a bar and a termination point $30_2$ of a bar do not overlap with the characters and numerals because the parts Bc1 and Bc2 shown in FIG. 3 are provided on the screen of the picture tube 18. In addition, because a character generator is provided in the character display system, the memory (character memory) capacity required for one picture may be small.

Figure 7:
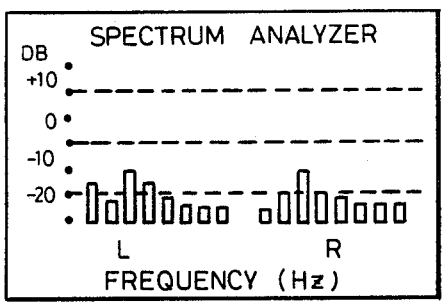
FIG. 7 is a diagram showing another display pattern obtained by another embodiment of a level display device for audio signal according to the present invention.

A modification of the above display method on the screen of the picture tube 18, is shown in FIG. 7. In FIG. 7, the L-channel display and the R-channel display of the input signal are separately provided instead of the above side by side arrangement.

As another method, the input signal level of a plurality of channels may be displayed in terms of channels.

In the above described embodiment, both the L-channel and the R-channel are displayed. However, only one of the channels may be displayed. Furthermore, it is not essential that the display is made with respect to the full band.

In addition, a plurality of channels may be displayed in the above described embodiment. In this case, certain number of filters, rectifying and smoothing circuits, comparators, multiplexers, and the like are required according to the number of channels which are to be displayed.

Moreover, the signal supplied to the input terminal 11 shown in FIG. 1 may be a signal varied of the frequency characteristic by being passed through a transmission path comprising equalizing amplifiers and the like.

If the bars $30a$ and $30b$ displaying the crosstalk signal are not generated, it is not essential to provide the blanking parts $B_{H1}$ and $B_{H2}$ in the horizontal direction of the bar.

It is not essential to provide the above blanking part Bc1. In a case where the bar display is to have priority over the measure taken to prevent the characters from overlapping with the bar, the bar of the input signal over +10 dB, for example, is displayed in a state overlapping with the characters.

Instead of using the above character generator 24, the CPU 23 and the RAM may be used to produce signals corresponding to predetermined characters.

Figure 8:
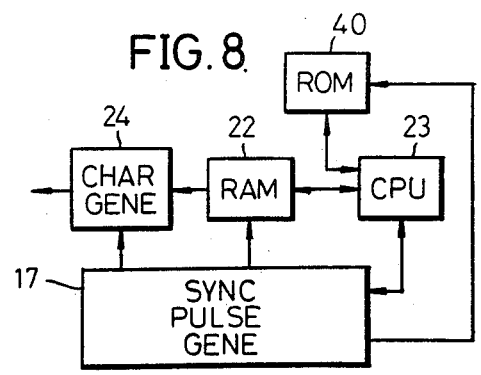
FIG. 8 is a general systematic block diagram showing another embodiment of an essential part of the block system shown in FIG. 1.

In the present embodiment, it is possible to change and re-write the characters and the like, because the above described CPU 23, RAM 22, and character generator 24 are used. However, the level display device according to the present invention is not limited to the above system, and may employ a system which uses a read only memory (ROM) and cannot change and re-write the characters and the like. In addition, a system may be employed wherein a ROM 40 and the RAM 22 are used together as shown in FIG. 8. In FIG. 8, the RAM 22 and the ROM 40 are operated in synchronism by the address signal obtained from the synchronizing pulse generator 17. Predetermined character information signals are obtained from the respective memories, by the command signal from the CPU 23.

The quantity of characters to be stored in the RAM 22 is not limited to the above thirty-two columns by sixteen rows, and may be a larger quantity.

Further, the multiplexers $15_1$ and $15_2$ are not limited to being switched by use of the 5-bit signal formed from the decoding signals p and q0 through q3. That is, the multiplexers may be switched by signals obtained in time division from a switch connected to the output side of the pulse width converter 14.

The method for providing the blanking parts of the bars is not limited to the above described method wherein the multiplexer 15 is strobed and controlled. For example, a circuit for gating and controlling the outputs of the multiplexers $15_1$ and $15_2$ may be provided between the multiplexers $15_1$ and $15_2$ and the adding gate 20. Moreover, when providing the blanking parts along the vertical direction of the bars, a voltage which decreases (or increases) with time only during an interval excluding the blanking parts ($B_{V1}$, $B_{V2}$, Bc1, and Bc2) as shown in FIG. 4(B) may be used as the comparison voltage which is applied to the input terminal $14_0$ shown in FIG. 2.

The video signal is not limited to black-and-white video signal, and may be a color video signal. If the video signal is a color video signal, a color video signal generator is provided at the output stage of the adding gate 20.

Figure 2:
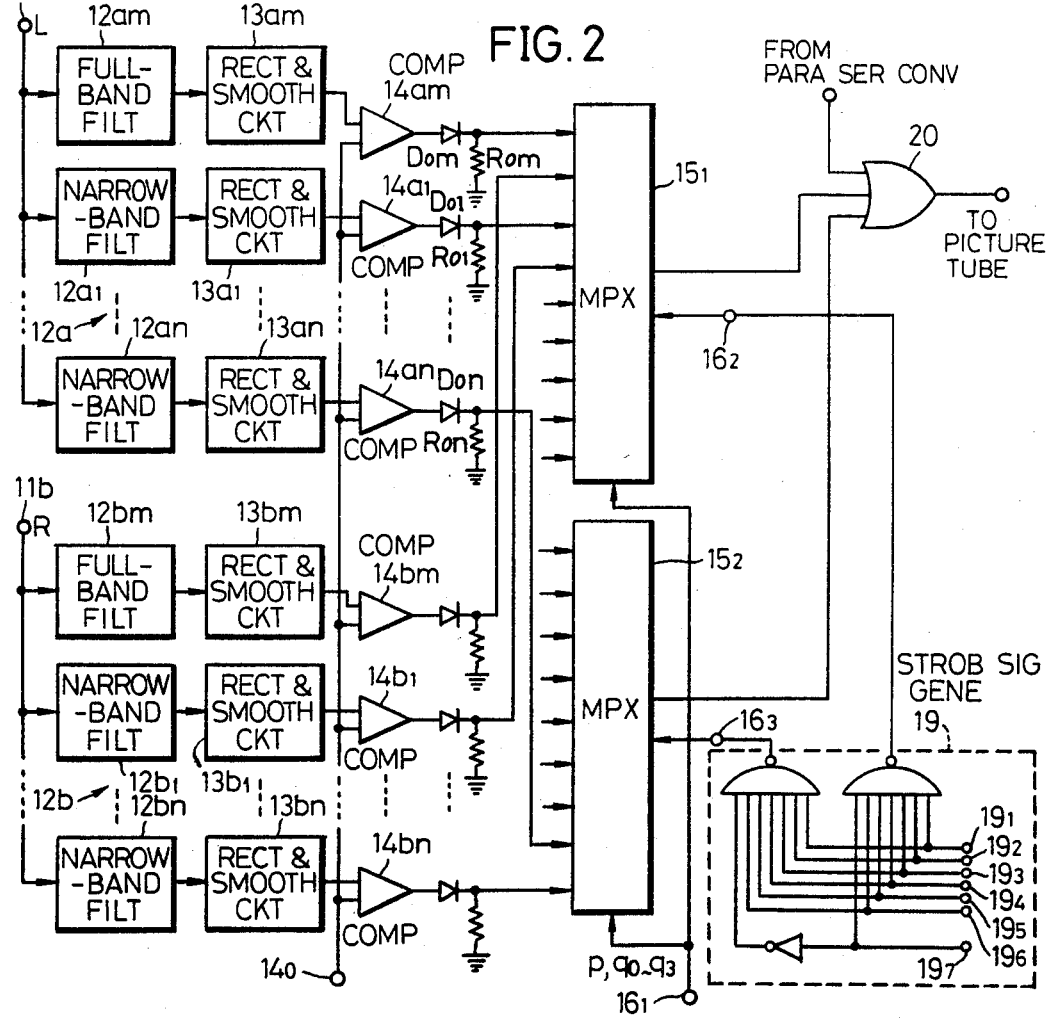
FIG. 2 is a concrete circuit diagram showing an essential part of the block system shown in FIG. 1.
Figure 9:
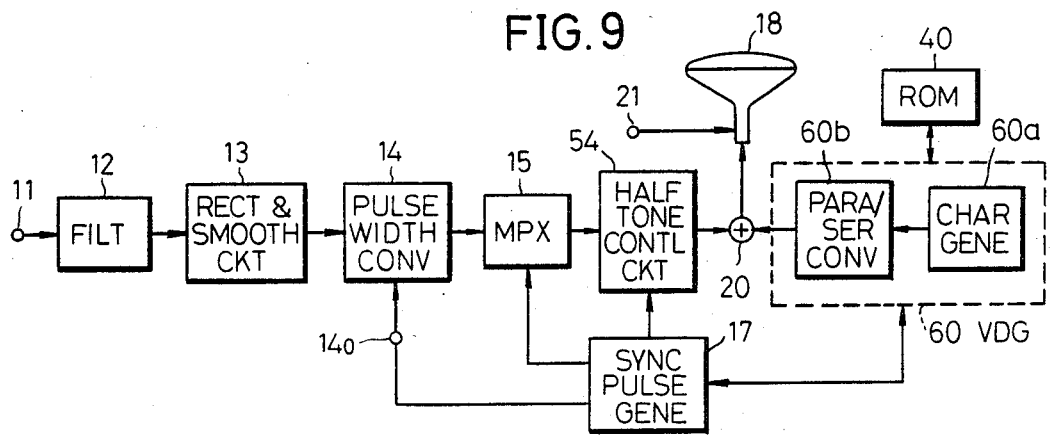
FIG. 9 is a general systematic block diagram showing a second embodiment of a level display device for audio signal according to the present invention.
Figure 10:
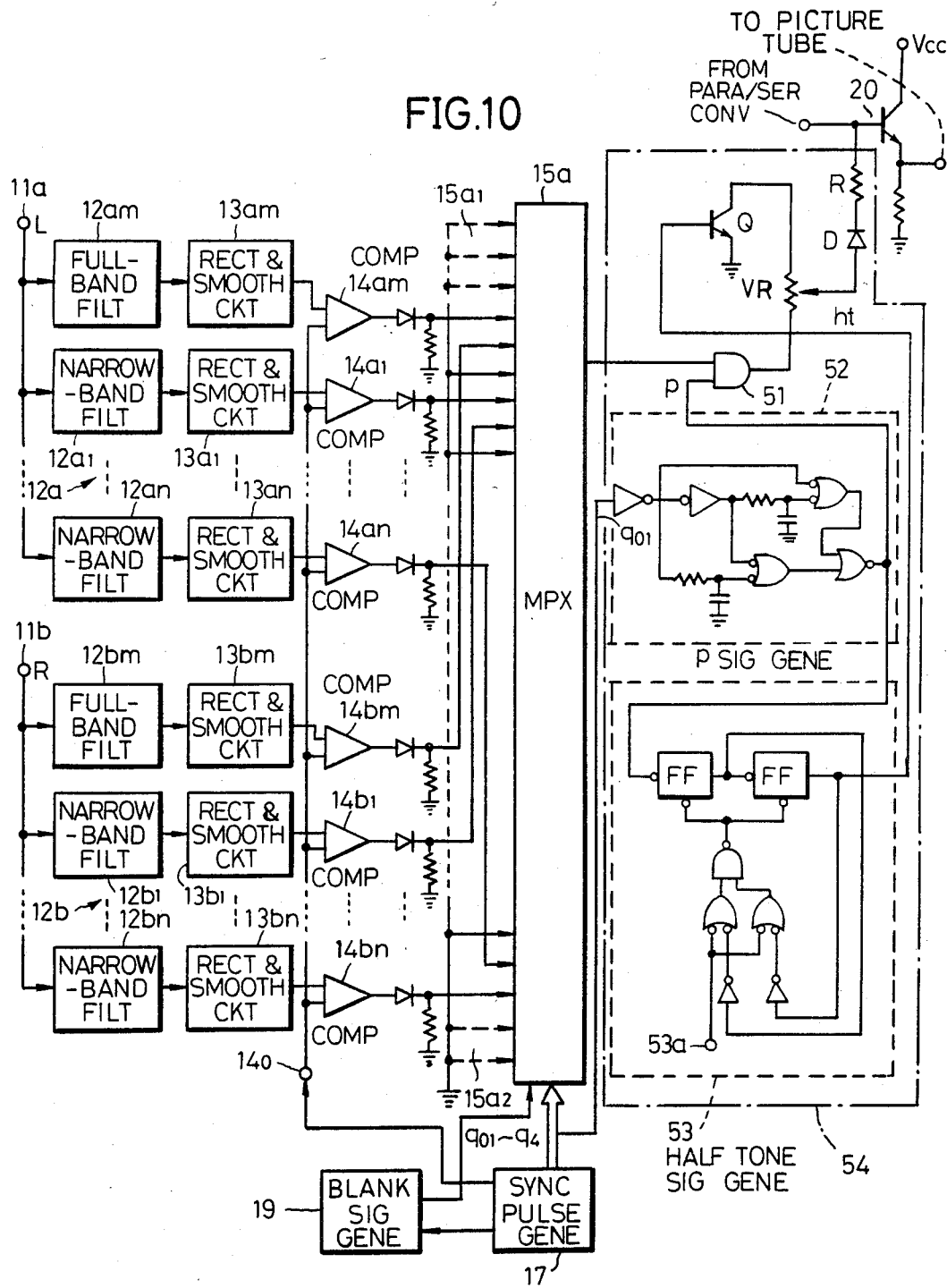
FIG. 10 is a concrete circuit diagram showing an essential part of the block system shown in FIG. 9.

Next, description will be given with respect to a second embodiment of a level display apparatus according to the present invention, by referring to FIGS. 9 and 10. In FIGS. 9 and 10, those parts which are the same as those corresponding parts in FIGS. 1 and 2 are designated by the same reference numerals, and their description will be omitted.

Figure 13:
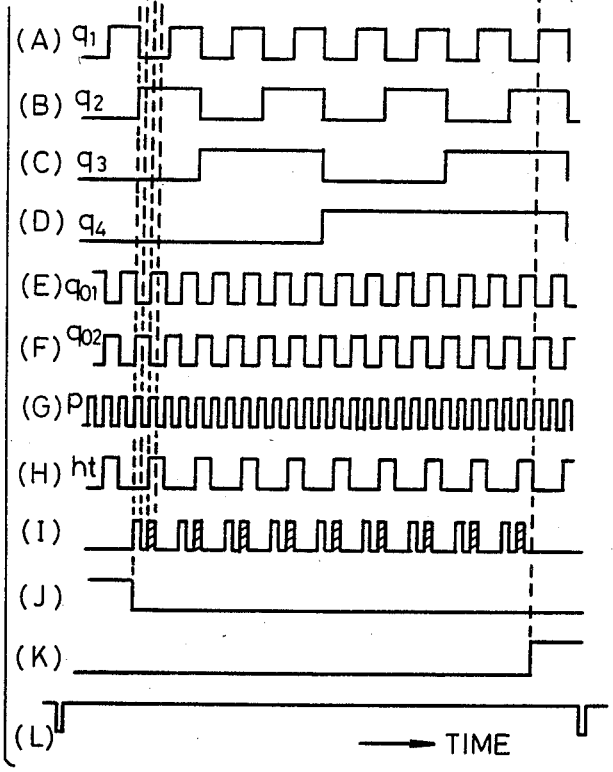

In FIG. 10, a multiplexer 15a is simultaneously supplied with signals q01 and q02 respectively shown in FIGS. 13(E) and 13(F) and the signals q1 through q4 respectively shown in FIGS. 13(A) through 13(D), in parallel, from the synchronizing pulse generator 17. The signals q1 through q4 are respectively obtained by successively frequency-dividing the above signal q01.

The horizontal scanning direction switching signal is obtained with a predetermined interval, by the combination of the above decoding signals q01, q02, and q1 through q4. The signals applied to each input terminal of the multiplexer 15a is successively subjected to time division during the horizontal scanning period, by the above switching signal. For example, signals are serially produced from the multiplexer 15a with a period which is twice the period of the signal q01. That is, during one horizontal scanning period of the video signal, a full-band signal and each of the narrow-band spectral signals are successively obtained serially with a predetermined interval, and with a timing corresponding to each of the horizontal direction display positions on the screen of a picture tube 18 (for example, the display interval in the horizontal direction has the pulse width of the pulse p as will be described hereinafter).

Figure 12:
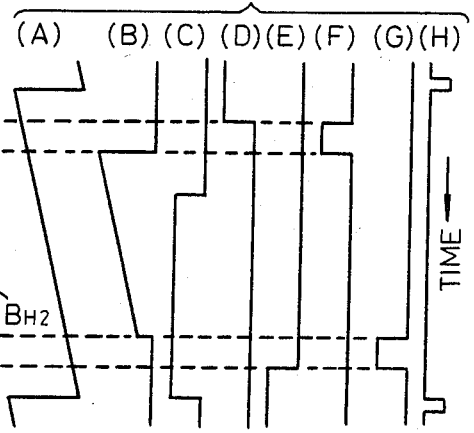
FIGS. 12(A) through 12(H) and FIGS. 13(A) through 13(L) are graphs respectively showing signal waveforms for obtaining the display pattern shown in FIG. 11.

For example, observation will first be made with respect to the full-band signal of the L-channel displayed at the upper left hand side of the screen of the picture tube 18. When a pulse signal shown in FIG. 12(C) is obtained from the comparator 14am, a high-level signal from the comparator 14am is gated by the horizontal scanning direction switching signal and obtained, at a predetermined time within one horizontal scanning period in a part corresponding to a rising point of the above pulse signal. During the high-level period of the pulse signal shown in FIG. 12(C), a signal is repeatedly and serially obtained from the multiplexer 15a with a predetermined interval, for every one horizontal scanning period.

In this case, each of the input terminals of the multiplexer 15a are connected so that the R-channel signal and the L-channel signal are successively and alternately obtained. Moreover, terminals connected to the inputs of the multiplexer 15a which are provided between adjacent frequencies, are respectively grounded so that no display is obtained between the displays of the adjacent frequencies. Accordingly, the L-channel and R-channel signals are serially obtained with a timing in synchronism with the decoding signals q01 and q02, with respective pulse widths of the signals q01 and q02. In addition, the signals for displaying the bars in adjacent frequency bands, are obtained with an open interval corresponding to the pulse width of the signal q01 (q02) therebetween.

The L-channel and R-channel signals thus serially and alternately obtained from the multiplexer 15a, are supplied to one input terminal of an AND-gate 51. On the other hand, the signal q01 obtained from the synchronizing pulse generator 17 is supplied to a p-signal generator 52. The signal q01 is converted into the signal p shown in FIG. 13(G) having a frequency which is twice the frequency of the above signal q01 at the p-signal generator 52, and is then supplied to the other input terminal of the AND-gate 51.

At the AND-gate 51, an AND operation is carried out between the signal serially obtained from the multiplexer 15a and the signal p obtained from the p-signal generator 52. Hence, a signal shown in FIG. 13(I) is obtained from the AND-gate 51. The signal shown in FIG. 13(I) has a pulse width and width between channels respectively equal to the pulse width of the above signal p, and the width between adjacent frequencies is equal to three time the pulse width of the above signal p.

On the other hand, the output signal p of the p-signal generator 52 is supplied to a half-tone signal generator 53. Thus, a half-tone signal ht shown in FIG. 13(H) having a pulse width which is equal to twice the pulse width of the above signal p and a duty factor of $\frac{1}{3}$, is produced from the half-tone signal generator 53. The level of the above half-tone signal ht is high during the period in which the signal corresponding to the R-channel of the signal shown in FIG. 13(I) is obtained.

The half-tone signal generator 53 comprises flip-flops FF and logic circuits, as shown in FIG. 10. The horizontal synchronizing signal shown in FIG. 13(L) is applied to a terminal 53a of the half-tone signal generator 53. Because the flip-flops FF are reset for every horizontal scanning period, the timing of the half-tone signal ht is always constant along the horizontal direction of the screen of the picture tube.

The above half-tone signal ht is supplied to the base of a transistor Q. This transistor Q is turned ON only during the high-level period of the half-tone signal ht. Accordingly, the R-channel signal obtained from the AND-gate 51 during the above high-level period of the half-tone signal ht, is voltage-divided at a variable resistor VR and formed into a voltage is lower than the L-channel signal which will be described hereinafter. The voltage-divided signal is then supplied to the adding gate 20, through a diode D and a resistor R. On the other hand, the transistor Q is turned OFF during the low-level period of the half-tone signal ht. Therefore, during the low-level period of the half-tone signal ht, the L-channel signal obtained from the AND-gate 51 passes through the variable resistor VR, diode D, and resistor R, and is formed into a voltage higher than the above R-channel signal before being supplied to the adding gate 20.

Figure 11:
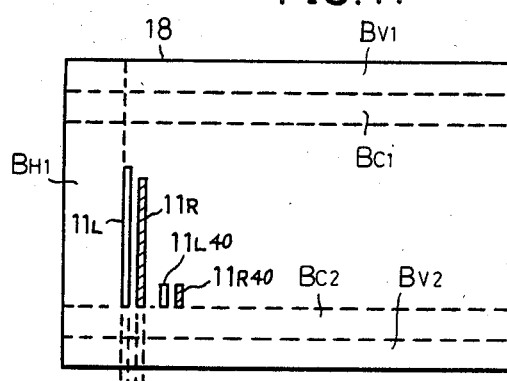
FIG. 11 is a diagram for explaining a display pattern on the screen of the picture tube obtained by the circuit shown in FIG. 10.

The signal thus supplied to the adding gate 20 is added with a character signal which will be described hereinafter, and then supplied to the picture tube 18. The signal supplied to the picture tube 18 is further added with the vertical and horizontal synchronizing signals obtained from the input terminal 21, and formed into the composite video signal. As a result, bars 11L, 11R, 11L40, and 11R40 are displayed on the screen of the picture tube 18 as shown in FIG. 11. These bars have lengths corresponding to the pulse widths of the pulse signals obtained from the pulse width converter 14, and widths corresponding to the pulse width of the signal p. The interval between the L-channel and R-channel signals is the same as the pulse width of the signal p. Moreover, by the above described half-tone signal, only the brightness of the R-channel signal is decreased. The interval between signals of adjacent frequencies, is equal to the pulse width of the above signal q0. In FIG. 10, a half-tone control circuit 54 comprises the p-signal generator 52 and the half-tone signal generator 53.

Figure 14A:
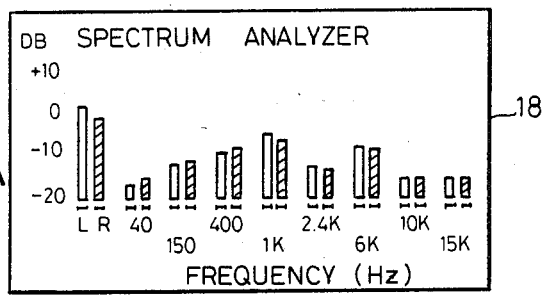
FIGS. 14A, 14B, and 14C are diagrams respectively showing display patterns obtained by the circuit shown in FIG. 10.
Figure 14B:
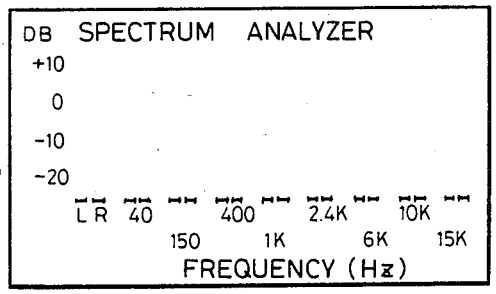
Figure 14C:
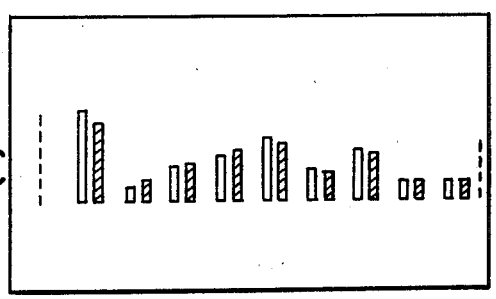

The signals in other frequency bands are similarly displayed as in the above case. The full-band signal and the signals of each of the frequency bands are displayed on the screen of the picture tube 18 as shown in FIG. 14C, for example.

As described above, according to the present embodiment, the L-channel signal and the R-channel signal are displayed side by side on the screen of the picture tube 18. Accordingly, it is easy to visually read the level differences between the channels for each of the frequencies. Thus, compared to a device which displays the channels separately, it is easier to read the level differences between channels. Moreover, because the bars are displayed with a difference in brightness between the channels, the channels may be discriminated with ease.

Next, description will be given with respect to the character display system. A video display generator (VDG) 60 shown in FIG. 9, comprises a character generator 60a and a parallel-to-serial converter (parallel/serial converter) 60b, and is driven by the decoding signals q0 through q4 of the synchronizing pulse generator 17. The character generator 60a comprises a memory corresponding to the dot matrix of characters, numerals, and the like. The memory in the character generator 60a stores thirty-two columns by sixteen rows of characters (alphabets, numerals, signs such as "+", "−", "()", and the like) on the screen of the picture tube 18, and the positions where the above characters are to be displayed on the screen, by the control signal obtained from the ROM 40. Binary codes corresponding to predetermined characters are obtained in parallel from the memory of the above character generator 60a, by the signal from the synchronizing pulse generator 17.

The parallel signal from the character generator 60a is converted into a serial signal capable of scanning in the vertical and horizontal directions on the screen of the picture tube 18, by the address signal from the synchronizing pulse generator 17, at the parallel/serial converter 60b. The character indication signal thus converted into a serial signal at the parallel/serial converter 60b, is supplied to the picture tube 18 through the adding gate 20. As a result, characters, "FREQUENCY (Hz)", "SPECTRUM ANALYZER", and the like, and numerals "40", "150", "+10", and the like, are displayed on the screen of the picture tube 18 as shown in FIG. 14B. These characters and numerals are displayed on the screen of the picture tube 18 at the above bar blanking parts, as in the above described first embodiment of the invention.

The spectral indication signal from the multiplexer 15a and the character indication signal from the parallel/serial converter 60b are added at the adding gate 20. Accordingly, the spectral display by bars and character display shown in FIG. 14A are simultaneously obtained on the screen of the picture tube 18. In this case, because the blanking parts for the bars are provided on the screen of the picture tube 18, the bars do not overlap with the characters.

Similarly as in the case of the above described first embodiment of the invention, the signal shon in FIG. 12(B) may be used as the comparison voltage.

Instead of using the blanking signals shown in FIGS. 13(J) and 13(K) when obtaining the blanking parts $B_{H1}$ and $B_{H2}$ along the horizontal direction of the bars as in the above described first embodiment.

In the present embodiment, the interval between the bar display of the R-channel and the bar display of the L-channel is obtained by grounding the input terminal of the multiplexer 15a. However, another method may be used in which a signal for preventing the signal in the above interval from being obtained from the multiplexer 15a.

Further, in the present embodiment, the brightness of the display of the R-channel is lower compared to the brightness of the L-channel display, but the arrangement may be made vice versa. In this case, the half-tone signal shown in FIG. 13(H) is generated within the pulse generation period corresponding to the L-channel shown in FIG. 13(I).

Figure 15:
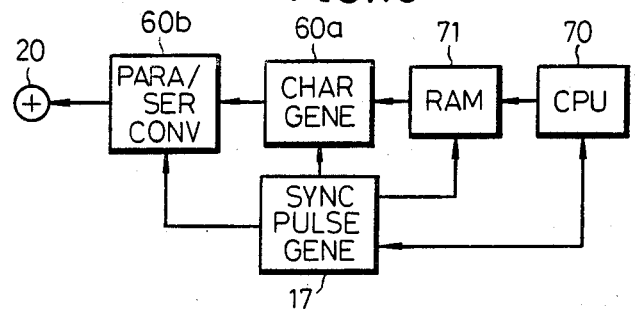
FIG. 15 is a general systematic block diagram showing another embodiment of an essential part of the block system shown in FIG. 9.

The character display system may be constructed as shown in FIG. 15, for example. In FIG. 15, a RAM 71 is stored with thirty-two columns by sixteen rows of characters, and is operated by the control signal from the CPU 21. Thus, the character generator 60a is operated by a command signal from the RAM 71 indicating predetermined characters and their positions. Parallel signals corresponding to the predetermined characters are hence obtained from the RAM 71, and supplied to the parallel/serial converter 60b.

Figure 16:
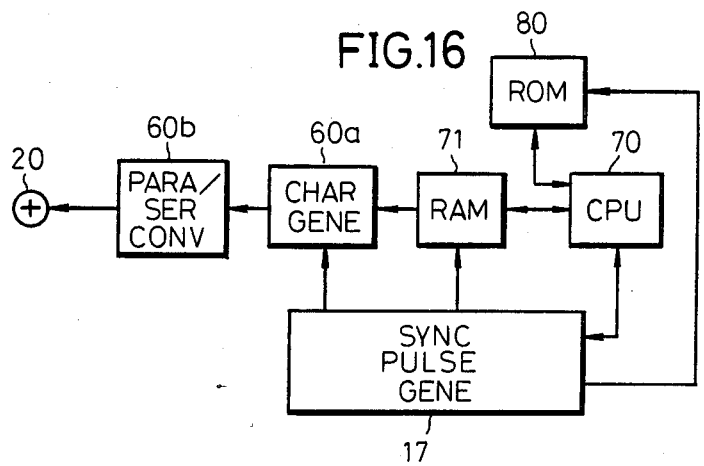
FIG. 16 is a general systematic block diagram showing still another embodiment of an essential part of the block system shown in FIG. 9.

In addition, as shown in FIG. 16, a system may be used which employs a ROM 80 and the RAM 71 together.

Figure 17:
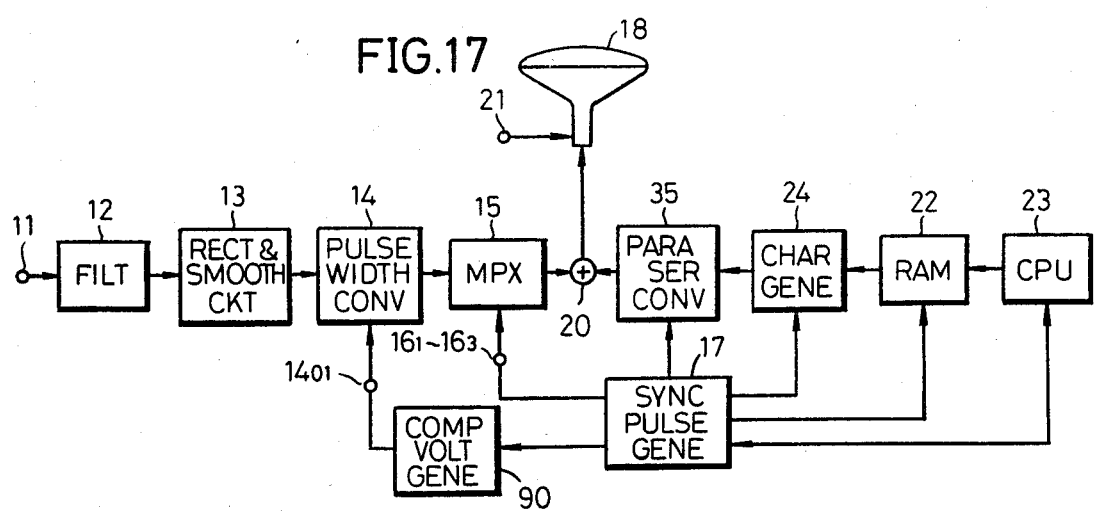
FIG. 17 is a general systematic diagram showing a third embodiment of a level display device for audio signal according to the present invention.
Figure 18:
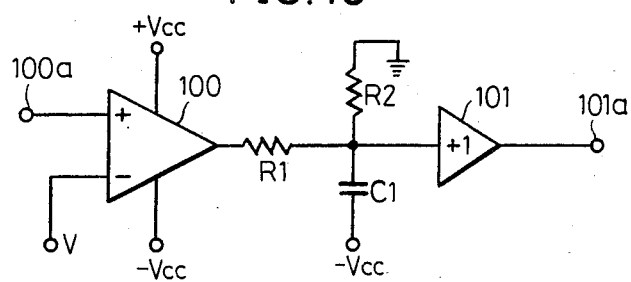
FIG. 18 is a concrete circuit diagram showing a comparison voltage generating circuit within the block system shown in FIG. 17.

Next, description will be given with respect to a third embodiment of a level display device according to the present invention. In FIG. 17, those parts which are the same as those corresponding parts in FIG. 1 are designated by the same reference numerals, and their description will be omitted. A comparison voltage generator 90 has a construction shown in FIG. 18. In FIG. 18, the vertical synchronizing signal shown in FIG. 19(A) obtained from the synchronizing pulse generator 17 is supplied to a non-inverting input terminal of an operational amplifier 100 through an input terminal 100a. A reference voltage V shown in FIG. 15(A) between the low-level voltage and the high-level voltage, is suppled to an inverting input terminal of the operational amplifier 100. An output terminal of the above operational amplifier 100 is connected to an input terminal of a buffer amplifier 101, through a resistor R1 having a sufficiently low resistance. The input terminal of the buffer amplifier 101 is also connected to a resistor R2 having the other end connected to ground and a capacitor C1 having the other end supplied with the power source voltage −Vcc. The operational amplifier 100 may be assumed as a switch which short-circuits the output terminal of the operational amplifier 100 and the end of the capacitor C1 supplied with the power source voltage −Vcc when the signal from the input terminal 100a is of low level, and open-circuits when the signal from the input terminal 100a is of high level.

Accordingly, the voltage at an output terminal 101a of the buffer amplifier 101 is ground level (zero) when the vertical synchronizing signal obtained from the input terminal 100a is of high level, and is −Vcc when the vertical synchronizing signal changes to low level. This is because the capacitor C1 is appropriately short-circuited. Thereafter, when the vertical synchronizing signal becomes of high level, the capacitor C1 becomes charged by the power source voltage −Vcc. Hence, the voltage at the output terminal 101a rises exponentially to ground level, with a time constant determined by the resistor R2 and the capacitor C1. The comparison voltage generator 90 is supplied with the signal shown in FIG. 19(A) obtained from the synchronizing pulse generator 17, and generates a comparison voltage shown in FIG. 19(B) which rises exponentially. The comparison voltage thus generated from the comparison voltage generator 90 is supplied to the pulse width generator 14, through an input terminal $14_{01}$.

Figure 19:
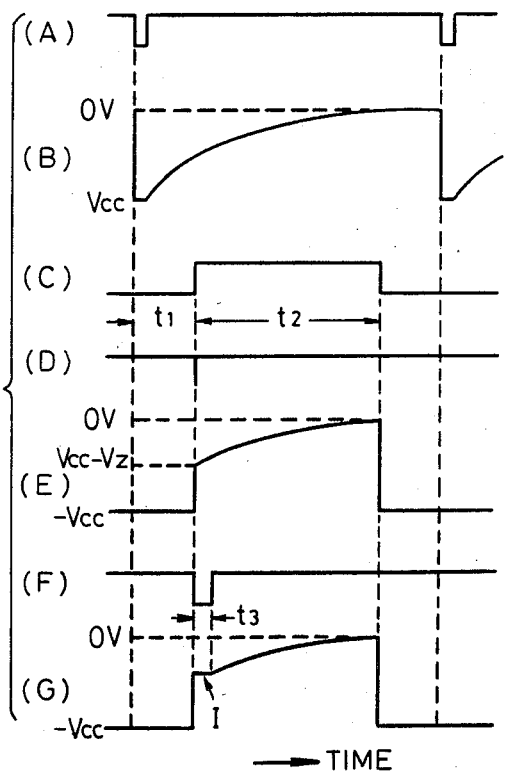
FIGS. 19(A) through 19(G) are graphs respectively showing signal waveforms for explaining operations of the block system shown in FIG. 17 and the circuit shown in FIG. 18.

Levels of the comparison voltage shown in FIG. 19(B) and the voltage obtained from the rectifying and smoothing circuit 13, are compared at the pulse width converter 14. As a result, a pulse having a pulse width corresponding to the interval at which the above voltage from the rectifying and smoothing circuit 13 becomes larger than the absolute value of the comparison voltage, is obtained from the pulse width converter 14.

Generally, the level of the audio signal is described interms of "dB". Accordingly, a circuit is required to logarithmicly convert the level of the audio signal.

In the above described first and second embodiments of the invention, the comparison voltage rises linearly as shown in FIGS. 4(A) and 12(A). In these first and second embodiments, the bandpass filters 12a1 through 12an, 12am, 12b1 through 12bn, and 12bm are respectively provided with a logarithmic amplifier for logarithmicly converting the input signal level. On the other hand, in the third embodiment of the invention, the comparison voltage rises exponentially as shown in FIG. 19(B). Therefore, in the third embodiment, because the logarithmic amplifiers which are easily affected of their characteristics by the ambient temperature are not used as in the first and second embodiments, the construction of the device becomes simple, and the operation of the device becomes stable.

Figure 20:
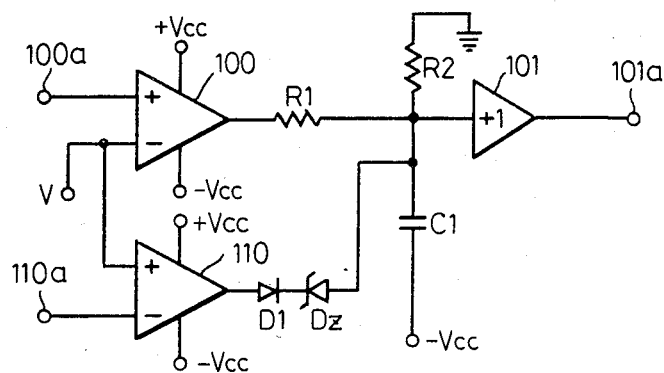
FIG. 20 is a concrete circuit diagram showing another embodiment of a comparison voltage generating circuit within the block system shown in FIG. 17.

Next, description will be given with respect to a modification of the comparison voltage generator in conjunction with FIG. 20. In FIG. 20, those parts which are the same as those corresponding parts in FIG. 18 are designated by the same reference numerals. A non-inverting input terminal of an operational amplifier 110 is connected to the inverting input terminal of the operational amplifier 100, and is supplied with the reference voltage V. On the other hand, an inverting input terminal of the operational amplifier 110 is connected to an input terminal 110a. An output terminal of the operational amplifier 110 is connected to the anode of a diode D1 provided to block current from flowing in the reverse direction. The cathode of the diode D1 is connected to the cathode of a Zener diode Dz, and the anode of the Zener diode Dz is connected to the input terminal of the buffer amplifier 101.

A signal shown in FIG. 19(C) which assumes high level with a timing lagging the vertical synchronizing signal by a time t1 and thereafter assumes low level after a time t2 has elapsed, is supplied to the above input terminal 100a from the synchronizing pulse generator 17. On the other hand, a signal shown in FIG. 19(D) which assumes low level for an exceedingly short period with a timing lagging the vertical synchronizing signal by the time t1 and assumes high level during other periods, is supplied to the input terminal 110a from the synchronizing pulse generator 17. The reference voltage V is set to an intermediate voltage between the high level and low level of the signals shown in FIGS. 19(C) and 19(D). The operational amplifier 110 produces a voltage +Vcc during the low level period of the signal shown in FIG. 19(C), and a voltage −Vcc during the high level period of the signal shown in FIG. 19(C).

Accordingly, the voltage at the output terminal 101a is −Vcc during the low level period of the signal supplied to the input terminal 100a. Further, when the signal supplied to the input terminal 100a assumes high level and the signal supplied to the input terminal 110a assumes low level, the voltage at the output terminal 101a becomes a voltage (Vcc−Vz) which is obtained by introducing voltage drop to the output voltage +Vcc by the Zener diode Dz. The voltage at the output terminal 101a then rises exponentially as the capacitor C1 becomes charged, and finally reaches ground level. Thereafter, when the signal from the input terminal 100a assumes low level, the terminals of the capacitor C1 becomes short-circuited and the voltage at the output terminal 101a becomes equal to −Vcc. As a result, a comparison voltage having a waveform shown in FIG. 19(E) is obtained.

As shown in FIG. 19(E), the comparison voltage supplied to the pulse width converter 14 is equal to −Vcc at a part in the vicinity of the vertical synchronizing signal, and the comparison voltage is always larger than the rectified voltage at this part. Hence, the upper part $B_{V1}$, the first row part Bc1 for characters, the lower part $B_{V2}$, and the thirteenth through sixteenth row part Bc2 for characters become blanked in the screen shown in FIG. 3, and the bars are only displayed at the central part of the screen of the picture tube 18. In this case, it is not necessary to supply the signals for blanking the above parts to the terminals $19_1$ through $19_4$ of the blanking signal and strobe signal generator 19.

Next, description will be given with respect to another example of the operation of the circuit shown in FIG. 20. In this example, a signal shown in FIG. 19(F) which assumes low level during a time t3 is supplied to the input terminal 110a, instead of the signal shown in FIG. 19(D). Thus, as shown in FIG. 19(G), the voltage waveform at the output terminal 101a starts from the voltage −Vcc, assumes the voltage (Vcc−Vz) when the signal from the input terminal 110a assumes low level, and rises exponentially in a similar manner as the waveform shown in FIG. 19(E) after holding the above voltage level (Vcc−Vz) for the time t3.

When the voltage to be compared which is obtained from the rectifying and smoothing circuit 13 becomes equal to the absolute value of a linear part I of the voltage shown in FIG. 19(G), the length of the bar displayed on the screen of the picture tube 18 increases rapidly, and remains at a constant length even if the above voltage to be compared rises. For this reason, if the interval in which the length of the bar increases logarithmicly with the rise of the above voltage to be compared, is made to correspond to the section indicating "−20" through "+10" in decibels on the screen shown in FIG. 6A, the bar extends upwards exceeding the position on the screen indicating +10 dB when overflow is encountered wherein the above voltage to be compared becomes equal to +10 dB. This extension of the bar over the position of +10 dB serves as a warning to indicate that the level is excessively large.

Figure 21:
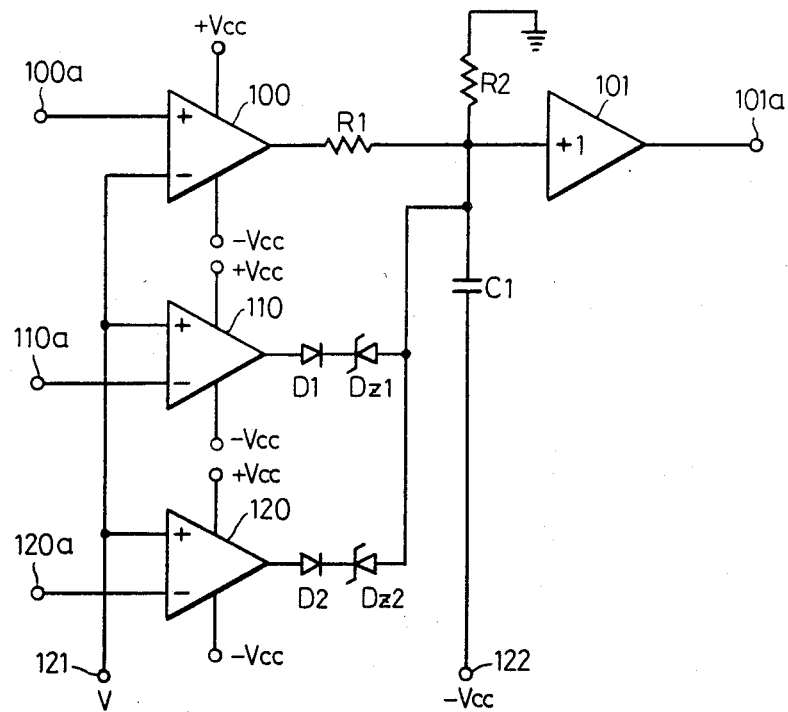
FIG. 21 is a concrete circuit diagram showing still another embodiment of a comparison voltage generating circuit within the block system shown in FIG. 17.

Next, description will be given with respect to a fourth embodiment of a level display device according to the present invention. In FIG. 21, those parts which are the same as those corresponding parts in FIG. 20 are designated by the same reference numerals, and their description will be omitted.

In the fourth embodiment of the invention, the comparison voltage generator 90 is constructed as shown in FIG. 21. In FIG. 21, a signal shown in FIG. 22(B) which is in synchronism with the vertical synchronizing signal shown in FIG. 22(A) obtained from the synchronizing pulse generator 17 shown in FIG. 17, is supplied to the input terminal 100a. The input terminal 100a is connected to the non-inverting input terminal of the operational amplifier 100. The power source voltages +Vcc and −Vcc are supplied to the operational amplifier 100, and the reference voltage V from an input terminal 121 is supplied to the inverting input terminal thereof. The output terminal of the operational amplifier 100 is connected to the input terminal of the buffer amplifier 101, through the resistor R1. The input terminal of the buffer amplifier 101 is connected to the resistor R2 having the other end grounded and the capacitor C1 having the other end supplied with the power source voltage −Vcc.

Figure 22:
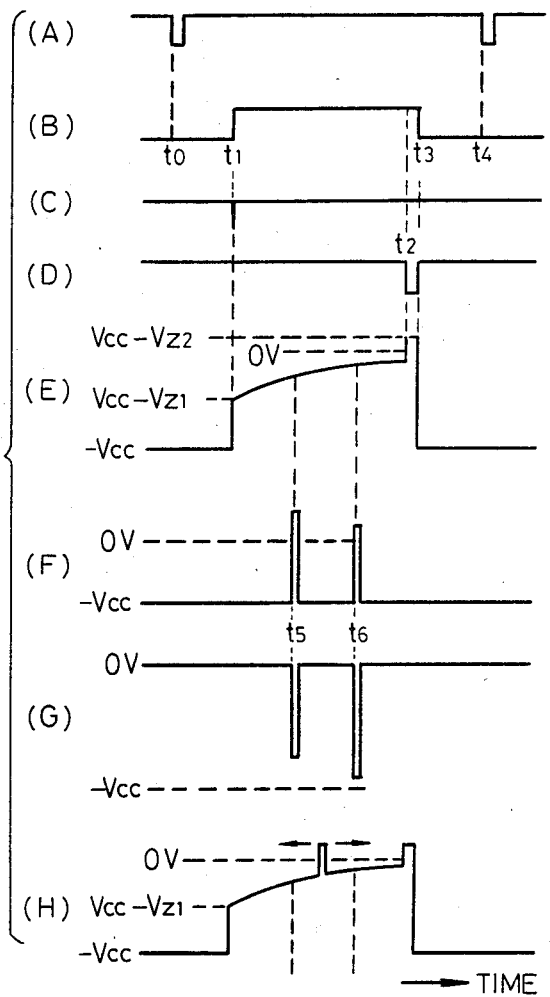
FIGS. 22(A) through 22(H) are graphs respectively showing signal waveforms for explaining operations of the block system shown in FIG. 17 and the circuit shown in FIG. 21.

The reference voltage V supplied to the operational amplifier 100, is set to an intermediate voltage between the high level and low level of the signal shown in FIG. 22(B) which is supplied from the input terminal 100a. When the signal from the input terminal 100a assumes low level, the input terminal 100a and the output terminal of the operational amplifier 100 become short-circuited. On the other hand, when the signal from the input terminal 100a assumes high level, the input terminal 100a and the output terminal of the operational amplifier 100 becomes open-circuited.

Signals respectively having waveforms shown in FIGS. 22(C) and 22(D), are supplied to the input terminal 110a and an input terminal 120a from the synchronizing pulse generator 17 shown in FIG. 17. These signals are then respectively supplied to the operational amplifier 110 and an operational amplifier 120. The signal shown in FIG. 22(C) comprises a low-level pulse of a short duration at the time t1 indicated in FIG. 22(B). On the other hand, the signal shown in FIG. 22(D) assumes low level at the time t2, and then assumes high level at the time t3 shown in FIG. 22(B).

The reference voltage V which is an intermediate voltage between the high-level voltage and the low-level voltage of the signal obtained from the input terminals 110a and 120a, is supplied to respective non-inverting input terminals of the operational amplifiers 110 and 120. These operational amplifiers 110 and 120 are supplied with the power source voltages +Vcc and −Vcc, and produce the voltage −Vcc during the high level period of the signals from the input terminals 110a and 120a, and produces the voltage +Vcc during the low-level period of the signals from the input terminals 110a and 120a.

The output terminals of the operational amplifiers 110 and 120 are respectively connected to the anodes of the diodes D1 and D2 provided for blocking current flow in the reverse direction. The cathodes of the diodes D1 and D2 are connected to the respective cathodes of Zener diodes Dz1 and Dz2. The anodes of the Zener diodes Dz1 and Dz2 are connected to the input terminal of the buffer amplifier 101.

The output voltage obtained from the output terminal 101a is equal to −Vcc during the low level period of the signal shown in FIG. 22(B). Because the level at the input terminal 100a becomes high and the level at the input terminal 110a instantaneously becomes low at the time t1, the output voltage of the operational amplifier 110 becomes equal to +Vcc. Accordingly, the voltage at the output terminal 101a becomes equal to (Vcc−Vz1), where (Vcc−Vz1) is less than zero. While the diode D1 conducts, and the Zener diode Dz1 introduces a voltage drop of Vz1. Thereafter, because the capacitor C1 is charged by the power source voltage −Vcc from an input terminal 122, the voltage at the output terminal 101a rises exponentially to approach ground level (zero).

When the level at the input terminal 120a becomes low between the times t2 and t3, the output voltage of the operational amplifier 120 becomes equal to +Vcc, and the voltage at the output terminal 101a becomes equal to (Vcc−Vz2), where (Vcc−Vz2) is greater than zero. While the diode D2 conducts, and the Zener diode Dz2 introduces a voltage drop of Vz2, where Vz2 is less than Vz1. When the level at the input terminal 100a becomes low at the time t3, the voltage at the output terminal 101a becomes equal to −Vcc.

Accordingly, a signal having a waveform shown in FIG. 22(E) is obtained from the output terminal 101a. This signal is supplied to the comparators 14a1 through 14an, 14am, 14b1 through 14bn, and 14bm as the comparison voltage.

The comparators 14a1 through 14an, 14am, 14b1 through 14bn, and 14bm respectively compare levels of the voltages to be compared which are obtained from the rectifying and smoothing circuits 13a1 through 13an, 13am, 13b1 through 13bn, and 13bm with the above comparison voltage. Thus, the comparators 14a1 through 14an, 14am, 14b1 through 14bn, and 14bm respectively generate a pulse having a pulse width such that the pulse is of high level during the interval in which the voltage to be compared is larger than the absolute value of the comparison voltage.

Figure 23:
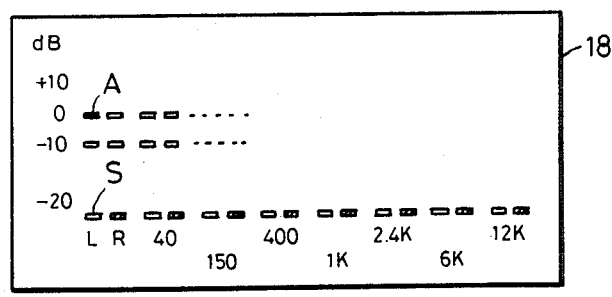
FIG. 23 is a diagram showing a display pattern obtained by the block system shown in FIG. 17 and the circuit shown in FIG. 21.

The comparison voltage is equal to or greater than zero between the times t2 and t3 during one vertical scanning period in the interval between the times t0 and t4. Hence, even if the voltage to be compared is zero, that is, even if there is no input signal, a starting position S of the bar is displayed on the screen of the picture tube 18 as shown in FIG. 23. Therefore, preventive measure is provided to prevent the operator from erroneously assuming breakdown of the device, since the starting position S is always displayed. In addition, by this constant display of the starting position S of the bar, it is easy to read out the levels in correspondence with the character display of the frequencies given below the bars.

The length of the bar is added on top of the length of the bar indicating the starting position. Thus, even at levels in the vicinity of −20 dB, the bar does not disappear completely. Hence, it is easy to discriminate whether a bar is being displayed. Moreover, because the same comparison voltage is used, the bar indicating the level and the bar indicating the starting position do not deviate from each other.

Next, description will be given with respect to another embodiment of the above comparison voltage generator 90. The comparison voltage may be a voltage obtained by adding the signals shown in FIGS. 22(E) and 22(F), which is equal to or greater than zero at arbitrary times t5 and t6 of the signal shown in FIG. 22(E). Therefore, even when no input signal is obtained, a scale line A is displayed at positions corresponding to −10 dB and 0 dB as shown in FIG. 23.

In addition, the comparison voltage may be a voltage obtained by adding the signals shown in FIGS. 22(E) and 22(G), which is equal to −Vcc at the times t5 and t6 of the signal shown in FIG. 22(E). For example, if the input signal level of +10 dB and the bar extends to the position indicating +10 dB from the starting position in FIG. 23, the parts corresponding to −10 dB and 0 dB of this bar may be erased to indicate that the input signal is over −10 dB and 0 dB.

The position of the above scale line A is not limited to the above positions, and may be provided at other positions on the screen.

As shown in FIG. 22(H), the above arbitrary times may be made variable. In FIG. 22(H), arrows indicate the directions towards which the time for generating the above pulse may be moved. As another method, the above times t5 and t6 may be fixed, and a variable time t7 may be additionally set.

Instead of using the operational amplifier, the above comparison voltage generator 90 may be constructed from an analog switch. In this case, a predetermined voltage formed from a constant voltage source may be used instead of forming the predetermined voltage by the Zener diode. Further, the method for generating the exponential comparison voltage is not limited to the above method using the charging and discharging of the capacitor, and a method may be employed which generates the exponential comparison voltage under control of a digital signal.

A circuit for detecting the peak level and the average level of the input audio signal may be provided in the level display device. In this case, signals respectively in accordance with these peak and average levels are subjected to an exclusive-OR operation. As a result, the signals subjected to the above exclusive-OR operation may be obtained serially by the multiplexer. According to this device, the peak level and the average level may respectively be displayed simultaneously at the upper and lower ends of a single bar. That is, two kinds of levels may be displayed simultaneously on a single bar. In addition, a circuit for detecting the maximum hold level may be additionally provided in this device, to further display the maximum hold level at the upper part of the single bar. According to this device, three kinds of levels may be displayed simultaneously on a single bar.

Further, the present invention is not limited to these embodiments, but various variations and modifications may be made without departing from the scope of the present invention.

What is claimed is:

1. A level display device for audio signal comprising:
a plurality of bandpass filters having filtering bands of respectively different center frequencies, for band-dividing and filtering an input signal supplied thereto through an input terminal;
pulse width converting means provided in correspondence with respective bandpass filters for converting the input signal into a pulse signal which is in synchronism with a vertical synchronizing signal of a video signal and has a pulse width representative of the level of said input signal, said pulse width converting means comprising a plurality of comparators each of which is supplied with one of the band-divided signals to one input terminal thereof and a comparison voltage to the other input terminal thereof, said comparison voltage being in synchronism with the vertical synchronizing signal and successively varying in the voltage level with time only during a predetermined interval within a vertical scanning period;
level indication signal producing means connected with outputs of said pulse width converting means in parallel, for serially producing said converted pulse signal in synchronism with a horizontal synchronizing signal by successively time-dividing said converted pulse signal during a horizontal scanning period;
character indication signal producing means stored with information signals for displaying characters and the like, for serially obtaining a character indication signal in synchronism with a synchronizing signal of said video signal;
video signal composing means driven by said video signal, for obtaining a video signal by composing an output of said level indication signal producing means and an output of said character indication signal producing means; and
display means for composing and displaying bars corresponding to the audio signal level in a vertical direction, characters, and the like, on a screen of a picture tube, by the outputs of said level indication signal producing means and said character indication signal producing means.

2. A level display device as claimed in claim 1 in which said characters are numerals and signs for displaying frequency bands, channel numbers, and a level scale, and characters for displaying units of the frequency bands and levels and for displaying their respective axes.

3. A level display device for audio signal comprising:
a plurality of bandpass filters having filtering bands of respectively different center frequencies, for band-dividing and filtering an input signal supplied thereto through an input terminal;
pulse width converting means provided in correspondence with respective bandpass filters for converting the input signal into a pulse signal which is in synchronism with a vertical synchronizing signal of a video signal and has a pulse width representative of the level of said input signal, said pulse width converting means comprising a plurality of comparators each of which is supplied with one of the band-divided signals to one input terminal thereof and a comparison voltage to the other input terminal thereof, said comparsion voltage being in synchronism with the vertical synchronizing signal and successively varying in the voltage level with time only during a predetermined interval within a vertical scanning period;

level indication signal producing means connected with outputs of said pulse width converting means in parallel, for serially producing said converted pulse signal in synchronism with a horizontal synchronizing signal by successively time-dividing said converted pulse signal during a horizontal scanning period;

blanking means for supplying a signal in synchronism with a synchronizing signal of the video signal to said level indication signal producing means, so as not to obtain a signal from said level indication signal producing means during a predetermined interval;

character indication signal producing means stored with information signals for displaying characters, numerals, and the like, for serially obtaining a character indication signal in synchronism with a synchronizing signal of said video signal; and video signal composing means driven by said video signal, for obtaining a video signal by composing an output of said level indication signal producing means and an output of said character indication signal producing means, said level display device blanking parts of bars which correspond to the audio signal level and are displayed on a screen of a picture tube by a signal from said blanking means, to display the audio signal level by composing the bars with characters and the like, by the outputs of said level indication signal producing means and said character indication signal producing means.

4. A level display device for audio signal comprising:

a plurality of bandpass filters having filtering bands of respectively different center frequencies for a right channel and a left channel, for band-dividing and filtering an input signal supplied thereto through an input terminal;

pulse width converting means provided in correspondence with respective bandpass filters for converting the input signal into a pulse signal which is in synchronism with a vertical synchronizing signal of a video signal and has a pulse width representative of the level of said input signal, said pulse width converting means comprising a plurality of comparators each of which is supplied with one of the band-divided signals to one input terminal thereof and a comparison voltage to the other input terminal thereof, said comparison voltage being in synchronism with the vertical synchronizing signal and successively varying in the voltage level with time only during a predetermined interval within a vertical scanning period;

level indication signal producing means connected with outputs of said pulse width converting means in parallel, for serially producing said converted pulse signal alternately for the right and left channels in synchronism with a horizontal synchronizing signal by successively time-dividing said converted pulse signal during a horizontal scanning period;

gating means for gating and obtaining an output signal from said level indication signal producing means only during a predetermined interval within the horizontal scanning period;

character indication signal producing means stored with information signals for displaying characters and the like, for serially obtaining a character indication signal in synchronism with a synchronizing signal of said video signal; and video signal composing means driven by said video signal, for obtaining a video signal by composing an output of said level indication signal producing means and an output of said character indication signal producing means, said level display device displaying bars corresponding to the audio signal level of the right and left channels in side by side arrangement by composing the bars with the characters and the like on a screen of a picture tube, by the output signals of said level indication signal producing means and said character indication signal producing means.

5. A level display device as claimed in claim 4 in which said gating means comprises means for separately converting the signals from said level indication signal producing means into respectively different voltages for the right and left channels, to display the bars of the right and left channel signals with respectively different brightness by the different converted voltages.

6. A level display device for audio signal comprising:

a plurality of bandpass filters having filtering bands of respectively different center frequencies, for band-dividing and filtering an input signal supplied thereto through an input terminal;

comparison voltage generating means for generating a comparison voltage which is in synchronism with a vertical or horizontal synchronizing signal of a video signal, the voltage level of said comparison voltage varying exponentially with time during a vertical or horizontal scanning period;

pulse width converting means for rectifying said input signal and for comparing said rectified signal with said comparison voltage so as to convert said input signal into a pulse signal having a pulse width representative of the level of said input signal, said pulse width converting means comprising a plurality of comparators each of which is supplied with one of the band-divided signals to one input terminal thereof and said comparison voltage to the other input terminal thereof;

level indication signal producing means connected with outputs of said pulse width converting means in parallel, for serially producing said converted pulse signal in synchronism with a horizontal synchronizing signal by successively time-dividing said converted pulse signal during a horizontal scanning period;

character indication signal producing means stored with information signals for displaying characters and the like, for serially obtaining a character indication signal in synchronism with a synchronizing signal of said video signal; and video signal composing means driven by said video signal, for obtaining a video signal by composing an output of said level indication signal producing means and an output of said character indication signal producing means, said level display device displaying bars corresponding to the audio signal level by composing the bars with the characters and the like on a screen of a picture tube, by the output signals of said level indication signal producing means and said character indication signal producing means.

7. A level display device as claimed in claim 6 in which said comparison voltage generating means comprises at least one operational amplifier, a capacitor, and a buffer amplifier, and a comparison voltage which assumes a predetermined voltage level after a predetermined time from the start of the vertical or horizontal synchronizing signal within said vertical or horizontal scanning period, varies exponentially with time from said predetermined voltage level, and assumes the voltage level upon starting of said synchronizing signal, is obtained from a terminal of said capacitor.

8. A level display device as claimed in claim 7 in which said comparison voltage generating means generates a comparison voltage which varies exponentially with time from said predetermined voltage level after maintaining said predetermined voltage level for a specific time period.

9. A level display device as claimed in claim 6 in which said comparison voltage generating means comprises at least one operational amplifier, a capacitor, and a buffer amplifier, and a comparison voltage which assumes a predetermined voltage level after a predetermined time from the start of the vertical or horizontal synchronizing signal within said vertical or horizontal scanning period, varies exponentially with time from said predetermined voltage level, and rapidly changes to a voltage level having a pulse width of a predetermined duration even when the audio signal is not supplied for a predetermined interval, is obtained from one terminal of said capacitor.

10. A level display device as claimed in claim 9 in which said comparison voltage generating means generates a comparison voltage which rapidly changes in voltage level during a short predetermined time period for an arbitrary number of times, during an interval in which the voltage level varies continuously.

* * * * *